US012805266B2

(12) United States Patent
Mori et al.

(10) Patent No.: US 12,805,266 B2
(45) Date of Patent: Nov. 17, 2026

(54) SUBSTRATE PROCESSING METHOD AND SUBSTRATE PROCESSING APPARATUS

(71) Applicant: Tokyo Electron Limited, Tokyo (JP)

(72) Inventors: Kiyoshi Mori, Fuchu City (JP); Haruhiko Furuya, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 999 days.

(21) Appl. No.: 18/145,885

(22) Filed: Dec. 23, 2022

(65) Prior Publication Data

US 2023/0207376 A1 Jun. 29, 2023

(30) Foreign Application Priority Data

Dec. 27, 2021 (JP) ................................. 2021-212032

(51) Int. Cl.
*H10P 72/78* (2026.01)
*H10P 72/30* (2026.01)
*H10P 72/76* (2026.01)

(52) U.S. Cl.
CPC .......... *H10P 72/78* (2026.01); *H10P 72/3302* (2026.01); *H10P 72/7618* (2026.01)

(58) Field of Classification Search
CPC ......... H01L 21/68764; H01L 21/68742; H01L 21/68792; H01L 21/6838; H01L 21/67742; H01L 21/68785
See application file for complete search history.

(56) References Cited

U.S. PATENT DOCUMENTS

| | | | | |
|---|---|---|---|---|
| 10,854,491 | B2 * | 12/2020 | Schaller | H01L 21/68785 |
| 2003/0044529 | A1 * | 3/2003 | Wu | H01L 21/6715 427/240 |
| 2015/0337442 | A1 * | 11/2015 | Agafonov | C23C 16/52 118/695 |
| 2021/0118700 | A1 * | 4/2021 | Chu | B25F 5/02 |
| 2021/0375662 | A1 * | 12/2021 | Reddy | B05B 13/0228 |
| 2022/0080551 | A1 * | 3/2022 | Fukunaga | B24B 7/226 |
| 2022/0277962 | A1 * | 9/2022 | Kodama | B24B 7/00 |

FOREIGN PATENT DOCUMENTS

JP 2017-098521 A 6/2017

* cited by examiner

*Primary Examiner* — Seahee Hong
(74) *Attorney, Agent, or Firm* — Armstrong Teasdale LLP

(57) ABSTRACT

A substrate processing method includes: a substrate processing process performing a substrate processing on a substrate in a state in which a stage is tilted by a drive mechanism so that a central axis of the stage, which passes through a center of a mounting surface mounted with the substrate and extends in a direction perpendicular to the mounting surface, forms a first angle other than 0° with respect to a predetermined reference axis of a shower plate, which extends in a vertical direction, while changing a position of the stage by the drive mechanism so that the central axis rotates around the reference axis while maintaining the first angle with respect to the reference axis.

15 Claims, 14 Drawing Sheets

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2021-212032, filed on Dec. 27, 2021, the entire contents of which are incorporated herein by reference.

TECHNICAL FIELD

The present disclosure relates to a substrate processing method and a substrate processing apparatus.

BACKGROUND

In Patent Document 1, there is known a technique of tilting and rotating a holding structure that holds a wafer during etching.

PRIOR ART DOCUMENTS

Patent Documents

Patent Document 1: Japanese Laid-Open Publication No. 2017-98521

SUMMARY

According to one embodiment of the present disclosure, there is provided a substrate processing method performed in a substrate processing apparatus including a processing container, a shower plate forming a ceiling wall of the processing container and configured to discharge gases used for a substrate processing, a stage arranged under the shower plate inside the processing container so as to face the shower plate and configured to mount a substrate thereon, and a drive mechanism configured to move the stage. The substrate processing method includes: a substrate processing process performing the substrate processing on the substrate in a state in which the stage is tilted by the drive mechanism so that a central axis of the stage, which passes through a center of a mounting surface mounted with the substrate and extends in a direction perpendicular to the mounting surface, forms a first angle other than 0° with respect to a predetermined reference axis of the shower plate, which extends in a vertical direction, while changing a position of the stage by the drive mechanism so that the central axis rotates around the reference axis while maintaining the first angle with respect to the reference axis.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing method and a substrate processing apparatus disclosed in the subject application will be described in detail with reference to the drawings. It should be noted that the disclosed substrate processing method and substrate processing apparatus are not limited by the following embodiments.

When substrate processing such as film formation or etching is performed on a substrate on which a recess is formed, an imbalance in the processing status of the substrate processing may occur in the upper portion and the lower portion of the side surface of the recess. As semiconductor devices have become highly integrated and miniaturized, the recess formed on a substrate becomes deeper and has a higher aspect ratio, and the imbalance in the processing status on the side surface of the recess becomes noticeable. Therefore, there is a demand for a technique capable of improving the imbalance in the processing status of the side surface of the recess formed on the substrate.

Embodiment

Configuration of Vacuum Processing System

Figure 1:
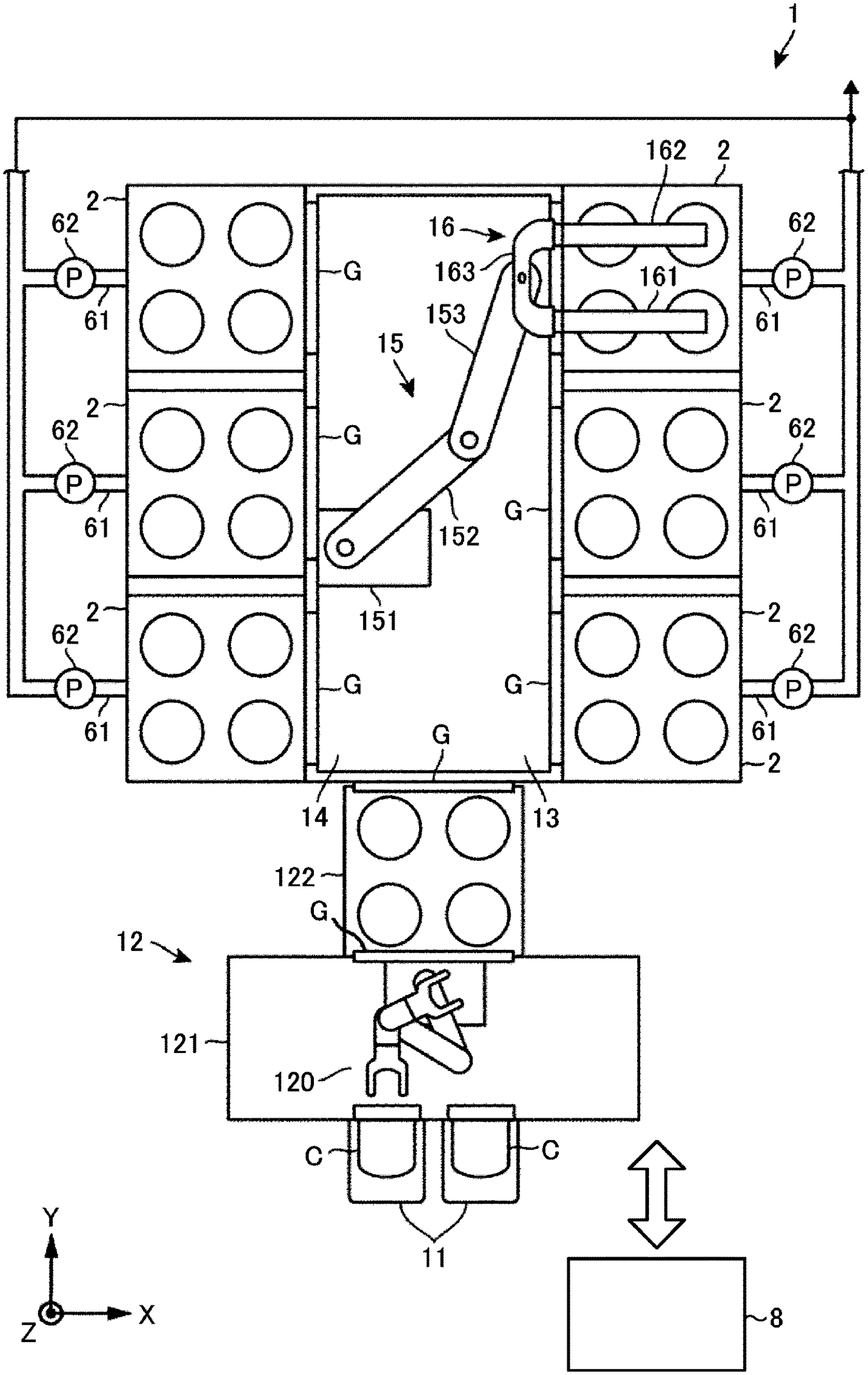
FIG. 1 is a schematic plan view showing an example of the configuration of a vacuum processing system according to an embodiment.

An example of a substrate processing apparatus according to the present disclosure will be described. In the embodiment described below, a case where the substrate processing apparatus of the present disclosure is used as a vacuum processing system having a system configuration will be described by way of example. FIG. 1 is a schematic plan view showing an example of the configuration of a vacuum processing system according to an embodiment. The vacuum processing system 1 includes loading/unloading ports 11, a loading/unloading module 12, a vacuum transfer module 13, and vacuum processing apparatuses 2. In FIG. 1, the X direction is the left-right direction, the Y direction is the front-rear direction, the Z direction is the vertical direction (height direction), and the loading/unloading ports 11 are located on the front side in the front-rear direction. The loading/unloading ports 11 are connected to the front side of the loading/unloading module 12, and the vacuum transfer module 13 is connected to the back side of the loading/unloading module 12 in the front-rear direction.

A carrier C, which is a transfer container containing substrates to be processed, is mounted on the loading/unloading port 11. The substrate is a wafer W, which is a circular substrate having a diameter of, for example, 300 mm. The loading/unloading module 12 is a module for loading and unloading the wafer W between the carrier C and the vacuum transfer module 13. The loading/unloading module 12 includes an atmospheric pressure transfer chamber 121 for transferring the wafer W to and from the carrier C in an atmospheric pressure atmosphere by a transfer mechanism 120, and a load lock chamber 122 configured to switch the atmosphere in which the wafer W is placed, between an atmospheric pressure atmosphere and a vacuum atmosphere.

The vacuum transfer module 13 has a vacuum transfer chamber 14 configured to maintain a vacuum atmosphere therein. A substrate transfer mechanism 15 is arranged inside the vacuum transfer chamber 14. The vacuum transfer chamber 14 is formed, for example, in a rectangular shape having long sides extending along the front-rear direction in a plan view. A plurality of (e.g., three) vacuum processing apparatuses 2 is connected to each of the rectangular long sides facing each other among the four side walls of the vacuum transfer chamber 14. A load lock chamber 122 installed in the loading/unloading module 12 is connected to the front short side among the four side walls of the vacuum transfer chamber 14. Gate valves G are arranged between the atmospheric pressure transfer chamber 121 and the load lock chamber 122, between the load lock chamber 122 and the vacuum transfer module 13, and between the vacuum transfer module 13 and the vacuum processing apparatus 2. The gate valves G are configured to open and close the loading/unloading ports for the wafer W provided in the respective modules connected to each other.

The substrate transfer mechanism 15 transfers the wafer W between the loading/unloading module 12 and the vacuum processing apparatuses 2 in a vacuum atmosphere. The substrate transfer mechanism 15 is composed of a multi joint arm and includes a substrate holder 16 for holding the wafer W thereon. The vacuum processing apparatus 2 performs substrate processing using a processing gas on multiple wafers W (e.g., four wafers W) at a time in a vacuum atmosphere. Therefore, the substrate holder 16 of the substrate transfer mechanism 15 is configured to hold, for example, four wafers W so as to collectively transfer the four wafers W to the vacuum processing apparatus 2.

Specifically, the substrate transfer mechanism 15 includes, for example, a base 151, a horizontally extending first arm 152, a horizontally extending second arm 153, and the substrate holder 16. The base side of the first arm 152 is provided on the base 151 so that the first arm 152 rotates about a vertical rotation axis on the base 151. The base side of the second arm 153 is provided on the tip portion of the first arm 152 so that the second arm 153 rotates about a vertical rotation axis on the tip portion of the first arm 152. The substrate holder 16 includes a first substrate holding portion 161, a second substrate holding portion 162, and a connecting portion 163. The first substrate holding portion 161 and the second substrate holding portion 162 are formed in the shape of two elongate spatula extending horizontally in parallel with each other. The connection portion 163 extends in a horizontal direction perpendicular to the extension direction of the first and second substrate holding portions 161 and 162, and connects the base ends of the first and second substrate holding portions 161 and 162 to each other. The central portion of the connecting portion 163 in the longitudinal direction is provided on the tip portion of the second arm 153 so that the connecting portion 163 rotates about a vertical rotation axis on the tip portion of the second arm 153. The first substrate holding portion 161 and the second substrate holding portion 162 will be described later.

The vacuum processing system 1 includes a controller 8. The controller 8 is, for example, a computer including a processor, a memory part, an input device, a display device, and the like. The controller 8 controls each part of the vacuum processing system 1. The controller 8 can use the input device to perform command input operations and the like for the operator to manage the vacuum processing system 1. In addition, the controller 8 can visualize and display the operation status of the vacuum processing system 1 using the display device. Furthermore, the memory part of the controller 8 stores a control program for controlling various processes executed in the vacuum processing system 1 by the processor, recipe data, and the like. The memory part may be a non-transient computer readable storage medium. Desired substrate processing is performed in the vacuum processing system 1 by the processor of the controller 8 executing the control program and controlling each part of the vacuum processing system 1 according to the recipe data.

[Configuration of Vacuum Processing Apparatus 2]

Figure 2:
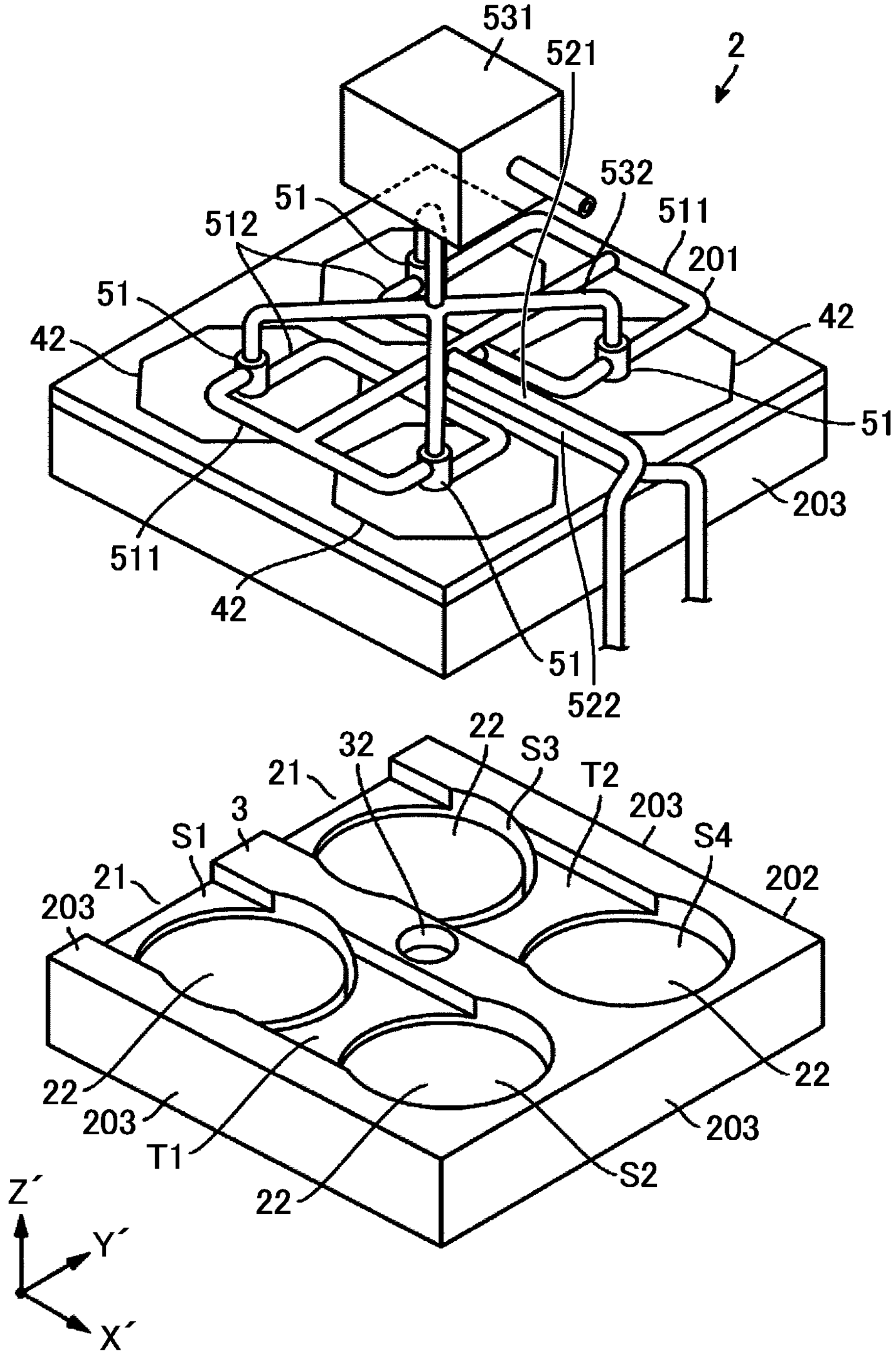
FIG. 2 is an exploded perspective view showing an example of the configuration of the vacuum processing apparatus according to the embodiment.
Figure 3:
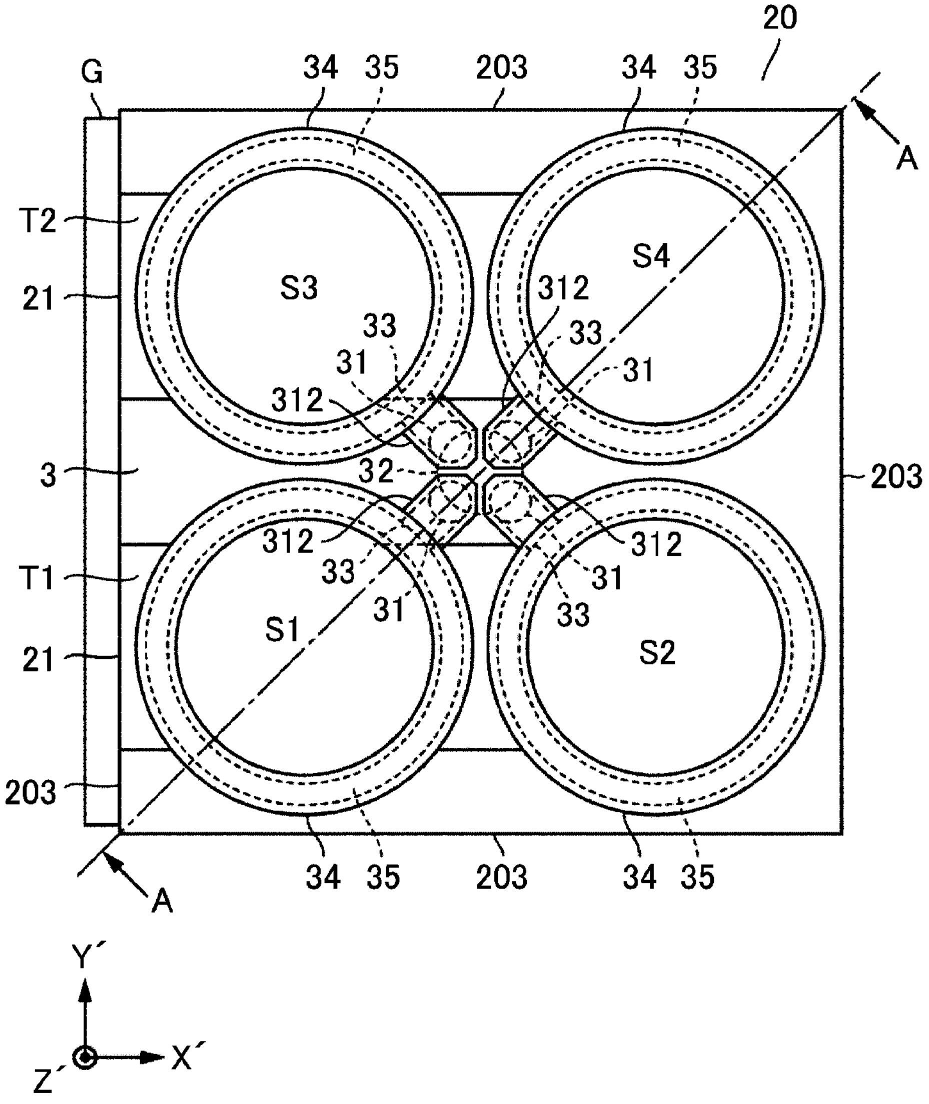
FIG. 3 is a plan view schematically showing the internal configuration of the vacuum processing apparatus according to the embodiment.

Next, the vacuum processing apparatus 2 will be described with reference to FIGS. 2 to 4. In the following description, a case where the vacuum processing apparatus 2 is used as a film forming apparatus that performs a film forming process, and the vacuum processing apparatus 2 performs a film forming process such as, for example, a plasma CVD (Chemical Vapor Deposition) process or the like on the wafer W as substrate processing will be described as a main example. FIG. 2 is an exploded perspective view showing an example of the configuration of the vacuum processing apparatus 2 according to the embodiment. FIG. 3 is a plan view schematically showing the internal configuration of the vacuum processing apparatus 2 according to the embodiment.

The six vacuum processing apparatuses 2 have the same configuration. The six vacuum processing apparatuses 2 can process wafers W in parallel. The vacuum processing apparatus 2 includes a processing container (vacuum container) 20 having a rectangular shape in a plan view. The processing container 20 is configured to maintain the inside thereof in a vacuum atmosphere. The processing container 20 is formed by closing the opening of a container body 202 having a concave opening on the upper surface thereof with a ceiling member 201. The processing container 20 has, for example, four side wall portions 203 surrounding the periphery of the processing container 20. Among the four side wall portions 203, the side wall portion 203 connected to the vacuum transfer chamber 14 is formed with two loading/unloading ports 21 arranged side by side in the front-rear direction (the Y' direction in FIG. 2). The loading/unloading ports 21 are opened and closed by the gate valves G.

As shown in FIGS. 2 and 3, inside the processing container 20, a first transfer space T1 and a second transfer space T2 extending horizontally from each loading/unloading port 21 so that wafers W are transferred therein are provided at the positions adjacent to each other. Further, an intermediate wall portion 3 is provided along the extension direction (the X' direction in FIG. 2) between the first transfer space T1 and the second transfer space T2 in the processing container 20. Two processing spaces S1 and S2 are arranged along the extension direction in the first transfer space T1, and two processing spaces S3 and S4 are arranged along the extension direction in the second transfer space T2. Therefore, in the processing container 20, a total of four processing spaces S1 to S4 are arranged in a 2×2 matrix when viewed from above. The horizontal direction referred to herein includes a direction slightly inclined with respect to the extension direction under the influence of manufacturing tolerances as long as there is no influence such as the contact between devices during the loading/unloading operations of the wafer W.

Figure 4:
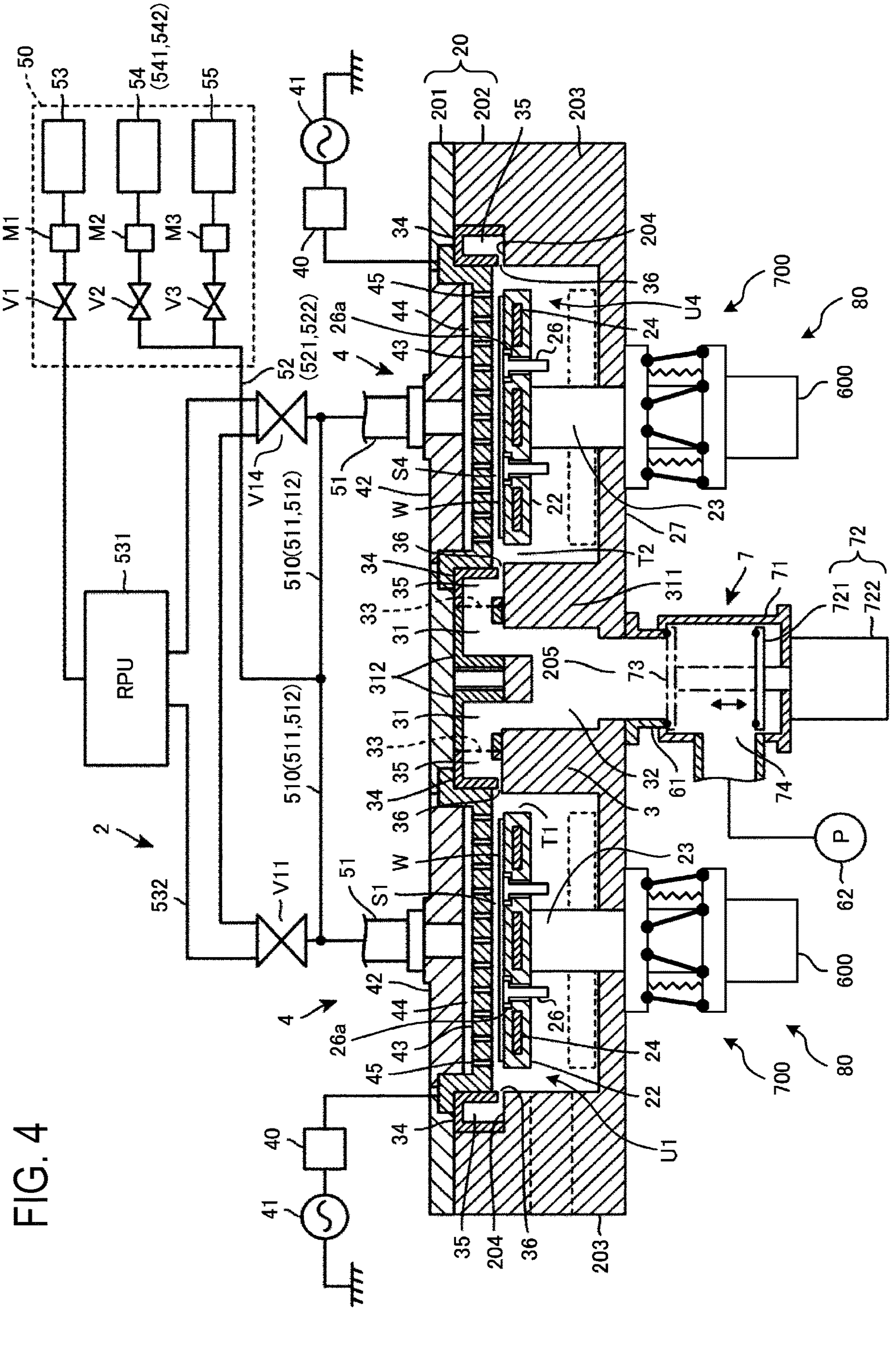
FIG. 4 is a schematic sectional view showing an example of the configuration of the vacuum processing apparatus according to the embodiment.

FIG. 4 is a schematic sectional view showing an example of the configuration of the vacuum processing apparatus 2 according to the embodiment. The cross section in FIG. 4 corresponds to the cross section of the vacuum processing apparatus 2 taken along line A-A in FIG. 3. Each of the four processing spaces S1 to S4 is formed between a stage 22 on which a wafer W is mounted and a gas supplier 4 arranged to face the stage 22. The four processing spaces S1 to S4 are configured similarly to each other. In other words, in the processing container 20, the stage 22 and the gas supplier 4 are provided for each of the four processing spaces S1 to S4. FIG. 4 shows the processing space S1 of the first transfer space T1 and the processing space S4 of the second transfer space T2. The processing space S1 will be described below by way of example.

The stage 22 also serves as a lower electrode, and is formed in a flat cylindrical shape by, for example, metal or aluminum nitride (AlN) in which a metal mesh electrode is embedded. The stage 22 is configured to be movable by a drive mechanism 80. The drive mechanism 80 includes a rotary drive mechanism 600 and an adjustment mechanism 700. The stage 22 is supported from below by a support member 23. The support member 23 has a cylindrical shape, extends vertically downward, and penetrates the bottom portion 27 of the processing container 20. The lower end portion of the support member 23 is positioned outside the processing container 20 and connected to the rotary drive mechanism 600. The support member 23 can be rotated about the support member 23 as a rotation axis by the rotary drive mechanism 600. The stage 22 is configured to be rotatable according to the rotation of the support member 23. The adjustment mechanism 700 for adjusting the position and inclination of the stage 22 is provided at the lower end portion of the support member 23. The stage 22 is configured to be movable up and down between a processing position and a delivery position via the support member 23 by the adjustment mechanism 700. In FIG. 4, the solid line depicts the stage 22 located at the processing position, and the broken line illustrates the stage 22 located at the delivery position. The processing position is a position at which substrate processing (e.g., film forming process) is performed, and the delivery position is a position at which the wafer W is delivered to and from the substrate transfer mechanism 15. The rotary drive mechanism 600 and the adjustment mechanism 700 will be described later.

A heater 24 is embedded in the stage 22. The heater 24 heats each wafer W mounted on the stage 22 to about 60 degrees C. to 600 degrees C. Moreover, the stage 22 is connected to a ground potential.

In addition, the stage 22 is provided with plural pin through holes 26*a* (e.g., three pin through holes 26*a*). Lifter pins 26 are arranged inside the pin through holes 26*a*, respectively. The pin through holes 26*a* are provided so as to penetrate the stage 22 from the mounting surface (upper surface) of the stage 22 to the rear surface (lower surface) opposite to the mounting surface. The lifter pins 26 are slidably inserted into the pin through holes 26*a*. The upper ends of the lifter pins 26 are suspended from the mounting surface side of the pin through holes 26*a*. That is, the upper ends of the lifter pins 26 have a larger diameter than the pin through holes 26*a*. At the upper end of each of the pin through holes 26*a*, there is formed a recess having a larger diameter and thickness than the upper end of each of the lifter pins 26 and capable of accommodating the upper end of each of the lifter pins 26. As a result, the upper ends of the lifter pins 26 are locked to the stage 22 and suspended from the mounting surface side of the pin through holes 26*a*. In addition, the lower ends of the lifter pins 26 protrude from the rear surface of the stage 22 toward the bottom portion 27 of the processing container 20.

As shown in FIG. 4, in a state in which the stage 22 is raised to the processing position, the upper ends of the lifter pins 26 are accommodated in the recesses of the pin through holes 26*a* on the mounting surface side. When the stage 22 is lowered to the delivery position, the lower ends of the lifter pins 26 abut against the bottom portion 27 of the processing container 20, and the lifter pins 26 move in the pin through holes 26*a* so that the upper ends of the lifter pins 26 protrude from the mounting surface of the stage 22. The processing container 20 may be provided with a lifter pin contact member on the bottom portion side, the lower ends of the lifter pins 26 may be configured to make contact with the lifter pin contact member, and the lifter pins 26 may be raised and lowered by the elevating operation of the lifter pin contact member.

Now, the first and second substrate holding portions 161 and 162 will be described. The first substrate holding portion 161 is configured to, when entering the first transfer space T1, hold the wafer W at a position corresponding to each of the arrangement positions of the processing spaces S1 and S2 in the first transfer space T1. The position corresponding to each of the arrangement positions of the processing spaces S1 and S2 in the first transfer space T1 refer to a position set so that the wafers W can be delivered to two stages 22 provided in the processing spaces S1 and S2 of the first transfer space T1. Further, the second substrate holding portion 162 is configured to, when entering the second transfer space T1, hold the wafer W at a position corresponding to each of the arrangement positions of the processing spaces S3 and S4 in the second transfer space T2. The position corresponding to each of the arrangement positions of the processing spaces S3 and S4 in the second transfer space T2 refer to a position set so that the wafers W can be delivered to two stages 22 provided in the processing spaces S3 and S4 of the second transfer space T2.

For example, the first and second substrate holding portions 161 and 162 are formed so that the widths of the first and second substrate holding portions 161 and 162 are smaller than the diameter of the wafer W. Each of the first and second substrate holding portions 161 and 162 supports two wafers W on the tip end side and the base end side thereof with a gap left therebetween. The wafers W supported on the tip end sides of the first and second substrate holding portions 161 and 162 are supported by, for example, the tip ends of the first and second substrate holding portions 161 and 162 at their central portions.

In this manner, for example, four wafers W are collectively transferred at the same time between the wafer transfer mechanism 15 and each stage 22 by the cooperative action of the substrate transfer mechanism 15, the lifter pins 26, and the stages 22.

A gas supplier 4 is provided on the ceiling member 201 of the processing container 20. The gas supplier 4 is provided above the stage 22 via a guide member 34 made of an insulating material. The gas supplier 4 has a function as an upper electrode. The gas supplier 4 includes a lid 42, a shower plate 43 facing the mounting surface of the stage 22 and forming a facing surface, and a gas flow chamber 44 formed between the lid 42 and the shower plate 43. A gas supply pipe 51 is connected to the lid 42. For example, the gas discharge holes 45 extending in the thickness direction are vertically and horizontally arranged in the shower plate 43. The shower plate 43 discharges a gas from each gas discharge hole 45 toward the stage 22 in a shower shape.

Each gas supplier 4 is connected to a gas supply system 50 via a gas supply pipe 51. The gas supply system 50 includes, for example, a supply source of a reaction gas (film forming gas), which is a processing gas, a supply source of a purge gas, a supply source of a cleaning gas, a pipe, a valve V, a flow rate adjuster M, and the like.

A high-frequency power source 41 is connected to the shower plate 43 via a matching device 40. The shower plate 43 functions as an upper electrode facing the stage 22. When high-frequency power is applied from the high-frequency power source 41 to between the shower plate 43, which is the upper electrode, and the stage 22, which is the lower electrode, the gas (e.g., the reaction gas in the example) supplied from the shower plate 43 to the processing space S1 is turned into plasma.

Next, the exhaust paths and the combined exhaust path formed in the intermediate wall portion 3 will be described. As shown in FIGS. 3 and 4, the intermediate wall portion 3 has exhaust paths 31 provided respectively for the four processing spaces S1 to S4, and a combined exhaust path 32 where the exhaust paths 31 join. The combined exhaust path 32 extends vertically within the intermediate wall portion 3. The intermediate wall portion 3 is composed of a wall portion body 311 provided on the container body 202 side and an exhaust path forming member 312 provided on the ceiling member 201 side. The exhaust paths 31 are provided inside the exhaust path forming member 312.

Further, an exhaust port 33 is formed for each of the processing spaces S1 to S4 on the wall surface of the intermediate wall portion 3 positioned on the outer side of the processing spaces S1 to S4. Each exhaust path 31 is formed in the intermediate wall portion 3 so as to connect the exhaust port 33 and the combined exhaust path 32. For example, each exhaust path 31 extends horizontally within the intermediate wall portion 3 and then bends downward to extend vertically. Each exhaust path 31 is connected to the combined exhaust path 32. For example, each exhaust path 31 has a circular cross section (see FIG. 3). The downstream end of each exhaust path 31 is connected to the upstream end of the combined exhaust path 32, and the upstream side of each exhaust path 31 serving as the exhaust port 33 is opened to the outside of each of the processing spaces S1 to S4.

An exhaust guide member 34 is provided around each of the processing spaces S1 to S4 so as to surround each of the processing spaces S1 to S4. The guide member 34 is, for example, an annular body provided so as to surround the region around the stage 22 located at the processing position with a gap left with respect to the stage 22. The guide member 34 is configured to form therein a flow path 35 having, for example, a rectangular vertical cross section and an annular shape in a plan view. FIG. 3 schematically shows the processing spaces S1 to S4, the guide members 34, the exhaust paths 31, and the combined exhaust path 32.

As shown in FIG. 4, the guide member 34 has, for example, a U-shaped vertical cross section, and the guide member 34 is disposed such that the opening of the U-shape faces downward. The guide member 34 is fitted into a recess 204 formed on the side of the intermediate wall portion 3 and the side wall portion 203 of the container body 202. The guide member 34 forms a flow path 35 with the members that constitute the intermediate wall portion 3 and the side wall portion 203.

The guide members 34 fitted into the recess 204 form slit exhaust ports 36 opened toward the processing spaces S1 to S4. In this manner, the slit exhaust ports 36 are formed along the circumferential direction in the side peripheral portions of the respective processing spaces S1 to S4. The exhaust port 33 is connected to the flow path 35. The processing gas exhausted from the slit exhaust ports 36 is allowed to flow toward the exhaust port 33.

A set of two processing spaces S1 and S2 arranged along the extension direction of the first transfer space T1, and a set of two processing spaces S3 and S4 arranged along the extension direction of the second transfer space T2 are focused. As shown in FIG. 3, the set of processing spaces S1 and S2 and the set of processing spaces S3 and S4 are arranged in a 180° rotational symmetry around the combined exhaust path 32 when viewed from above.

As a result, the flow paths of the processing gas extending from the respective processing spaces S1 to S4 to the combined exhaust path 32 via the slit exhaust ports 36, the flow paths 35 of the guide members 34, the exhaust ports 33, and the exhaust paths 31 are formed in a 180° rotational symmetry around the combined exhaust path 32. When focusing only on the flow paths of the processing gas by ignoring the positional relationship with the first and second transfer spaces T1 and T2 and the intermediate wall portion 3, it can be said that when viewed from above, the flow paths are formed in 90° rotational symmetry around the combined exhaust path 32.

The combined exhaust path 32 is connected to an exhaust pipe 61 via a combined exhaust port 205 formed in the bottom portion 27 of the processing container 20. The exhaust pipe 61 is connected via a valve mechanism 7 to a vacuum pump 62 forming an evacuation mechanism. For example, one vacuum pump 62 is provided for one processing container 20 (see FIG. 1), and the exhaust pipes 61 on the downstream side of the respective vacuum pumps 62 are merged and connected to, for example, a factory exhaust system.

The valve mechanism 7 opens and closes a process gas flow path formed in the exhaust pipe 61. The valve mechanism 7 includes, for example, a casing 71 and an opening/closing part 72. A first opening 73 connected to the exhaust pipe 61 on the upstream side is formed on the upper surface of the casing 71. A second opening 74 connected to the exhaust pipe 61 on the downstream side is formed on the side surface of the casing 71.

The opening/closing part 72 includes, for example, an opening/closing valve 721 and an elevating mechanism 722. The opening/closing valve 721 is sized to block the first opening 73. The elevating mechanism 722 is provided outside the casing 71 to raise and lower the opening/closing valve 721 in the casing 71. The opening/closing valve 721 is configured to move up and down between a closed position that closes the first opening 73 as indicated by a one-dot chain line in FIG. 4 and an open position where the opening/closing valve 721 retracts to below the first and second openings 73 and 74 as indicated by a solid line in FIG. 4. When the opening/closing valve 721 is in the closed position, the downstream end of the combined exhaust port 205 is closed and the evacuation of the inside of the processing container 20 is stopped. When the opening/closing valve 721 is in the open position, the downstream end of the combined exhaust port 205 is opened and the inside of the processing container 20 is evacuated.

Next, the processing gas supply system will be described with reference to FIG. 2. In the following, a case where two kinds of reaction gases are used will be described by way of example. A gas supply pipe 51 is connected to approximately the center of the upper surface of each gas supplier 4. The gas supply pipe 51 is connected to a first reaction gas supply source 541 and a purge gas supply source 55 via a first common gas supply path 521 by a first gas supply pipe 511. The gas supply pipe 51 is also connected to a second reaction gas supply source 542 and the purge gas supply source 55 via a second common gas supply path 522 by a second gas supply pipe 512. In FIG. 4, for the sake of convenience, the first common gas supply path 521 and the second common gas supply path 522 are shown collectively as a gas supply path 52. Further, the first reaction gas supply source 541 and the second reaction gas supply source 542 are shown collectively as a reaction gas supply source 54. Moreover, the first gas supply pipe 511 and the second gas supply pipe 512 are shown collectively as a gas supply pipe 510. A valve V2 and a flow rate adjuster M2 are used for supplying a reaction gas. A valve V3 and a flow rate adjuster M3 are used for supplying a purge gas.

The gas supply pipe 51 is also connected to a cleaning gas supply source 53 via a remote plasma unit (RPU) 531 by a cleaning gas supply path 532. The cleaning gas supply path 532 is branched into four cleaning gas supply paths on the downstream side of the RPU 531. The branched cleaning gas supply paths are connected to the gas supply pipes 51, respectively. On the upstream side of the RPU 531 in the cleaning gas supply path 532, a valve V1 and a flow rate adjuster M1 are provided. Further, on the downstream side of the RPU 531, valves V11 to V14 are provided for the respective branched pipes. During cleaning, the corresponding valves V11 to V14 are opened. For the sake of convenience, FIG. 4 shows only the valves V11 and V14. The gas supply system 50 supplies various gases used for film formation. For example, in the case of forming a silicon nitride (SiN) film by CVD, a Si-containing gas such as $SiH_4$ or the like is used as the reaction gas, and an inert gas such as $N_2$, Ar or the like is used as the purge gas. For example, $NF_3$ is used as the cleaning gas. For example, in the case of forming an insulating oxide ($SiO_2$) film by CVD, a tetraethoxysilane (TEOS) gas or an oxygen ($O_2$) gas is used as the reaction gas, and an inert gas such as a nitrogen ($N_2$) gas or the like is used as the purge gas. When the TEOS gas and the $O_2$ gas are used as the reaction gas, for example, the TEOS gas is supplied from the first reaction gas supply source 541, and the $O_2$ gas is supplied from the second reaction gas supply source 542. For example, a nitrogen trifluoride ($NF_3$) gas is used as the cleaning gas.

When viewed from the processing gas distributed from the common gas supply path 52, the processing gas paths extending from the gas supply pipes 51 to the gas suppliers 4 are formed so as to have the same conductance. For example, as shown in FIG. 2, the downstream side of the first common gas supply path 521 is branched into two gas supply paths, and each of the branched gas supply paths is further branched into two gas supply paths to form the first gas supply pipes 511 in a tournament shape. The first gas supply pipes 511 are connected to the gas supply pipes 51 on the downstream side of the cleaning gas valves V11 to V14, respectively. Further, the downstream side of the second common gas supply path 522 is branched into two gas supply paths, and each of the branched gas supply paths is further branched into two gas supply paths to form the second gas supply pipes 512 in a tournament shape. The second gas supply pipes 512 are connected to the gas supply pipes 51 on the downstream side of the cleaning gas valves V11 to V14, respectively.

The first gas supply pipes 511 are formed so that the length from the upstream end (the end connected to the first common gas supply path 521) to the downstream end (the end connected to the gas supplier 4 or the gas supply pipe 51) and the inner diameter thereof are uniform between the first gas supply pipes 511. In addition, the second gas supply pipes 512 are formed so that the length from the upstream end (the end connected to the second common gas supply path 522) to the downstream end and the inner diameter thereof are uniform between the second gas supply pipes 512. In this way, when viewed from the processing gas distributed from the first common gas supply path 521, the respective processing gas supply paths extending to the combined exhaust path 32 via the first gas supply pipes 511, the gas suppliers 4, the processing spaces S1 to S4, and the exhaust paths 31 are formed to have the same conductance. In addition, when viewed from the processing gas distributed from the second common gas supply path 522, the respective processing gas supply paths extending to the combined exhaust path 32 via the second gas supply pipes 512, the gas suppliers 4, the processing spaces S1 to S4, and the exhaust paths 31 are formed to have the same conductance.

The vacuum processing apparatus 2 is connected to the controller 8 of the vacuum processing system 1. The controller 8 is, for example, a computer including a processor, a memory, a memory part, and the like. The controller 8 controls each part of the vacuum processing apparatus 2. The controller 8 allows an operator to use an input device to perform command input operations and the like for managing the vacuum processing apparatus 2. Further, in the controller 8, the operation status of the vacuum processing apparatus 2 can be visualized and displayed by a display device. Furthermore, the memory part of the controller 8 stores a control program for controlling various processes executed by the vacuum processing apparatus 2 using the processor, and recipe data. A desired process is executed in the vacuum processing apparatus 2 by the processor of the controller 8 executing the control program and controlling each part of the vacuum processing apparatus 2 according to the recipe data. For example, the controller 8 controls each part of the vacuum processing apparatus 2 to perform substrate processing such as an etching process, a film forming process, or the like on a substrate loaded into the vacuum processing apparatus 2.

[Configuration of Rotary Drive Mechanism and Adjustment Mechanism]

Figure 5:
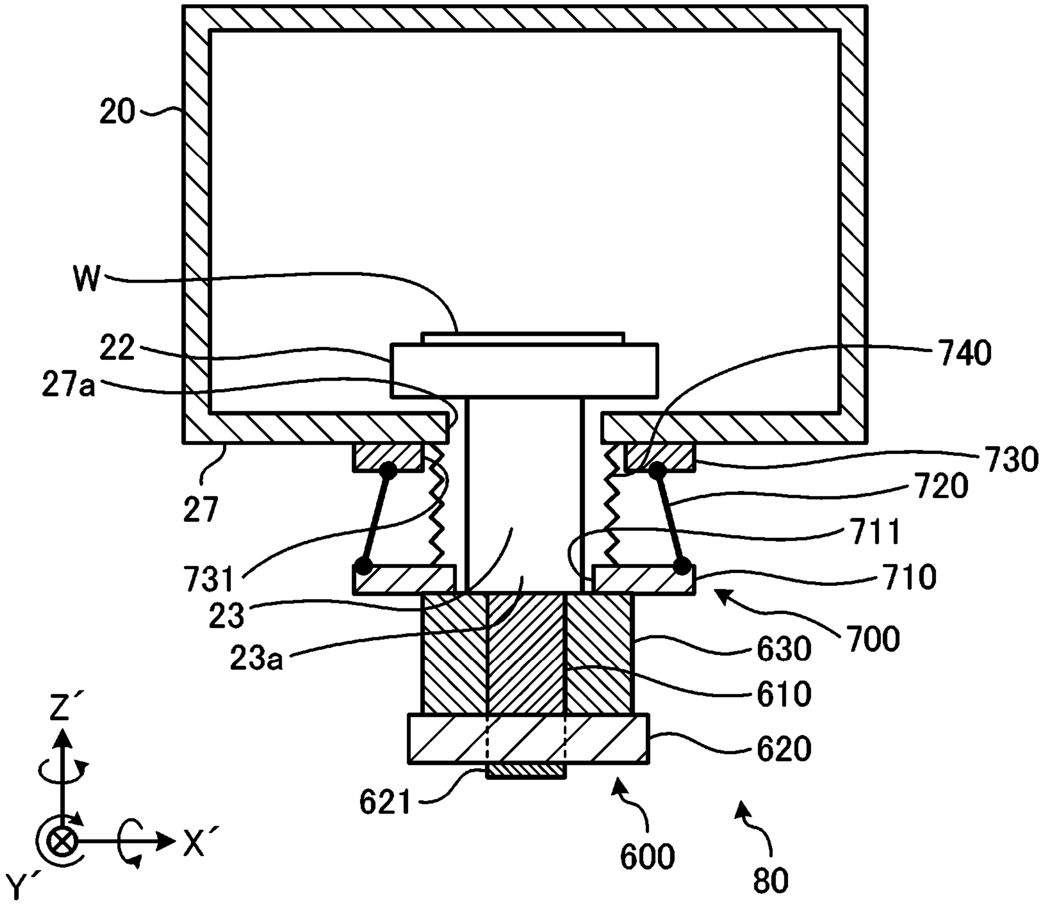
FIG. 5 is a diagram illustrating an example of the configuration of a rotary drive mechanism and an adjustment mechanism according to the embodiment.

FIG. 5 is a diagram showing an example of the configuration of the rotary drive mechanism 600 and the adjustment mechanism 700 according to the embodiment. A hole 27*a* is formed in the bottom portion 27 of the processing container 20 so as to correspond to the position where the stage 22 is supported. The support member 23 that supports the stage 22 from below is inserted into the hole 27*a*. The rotary drive mechanism 600 is connected to the lower end portion 23*a* of the support member 23 located outside the processing container 20.

The rotary drive mechanism 600 includes a rotary shaft 610, a motor 620, and a vacuum seal 630.

The rotary shaft 610 is connected to the lower end portion 23*a* of the support member 23 and configured to be rotatable integrally with the support member 23. A slip ring 621 is provided at the lower end of the rotary shaft 610. The slip ring 621 has electrodes and is electrically connected to various wirings for supplying electric power to components around the stage 22. For example, the slip ring 621 is electrically connected to a wiring for supplying electric power to the heater 24 embedded in the stage 22. Further, for example, when an electrostatic chuck for electrostatically attracting the wafer W is provided on the stage 22, the slip ring 621 is electrically connected to a wiring for a DC voltage applied to the electrostatic chuck.

The motor 620 is connected to the rotary shaft 610 to rotate the rotary shaft 610. When the rotary shaft 610 rotates, the stage 22 is rotated via the support member 23. When the rotary shaft 610 rotates, the slip ring 621 is also rotated together with the rotary shaft 610, and the electrical connection between the slip ring 621 and various wirings for supplying electric power to the components around the stage 22 is maintained.

The vacuum seal 630 is, for example, a ferrofluidic seal. The vacuum seal 630 is provided around the rotary shaft 610 to hermetically seal the rotary shaft 610 while maintaining the rotation of the rotary shaft 610.

The adjustment mechanism 700 is engaged with the lower end portion 23*a* of the support member 23 via the vacuum seal 630.

The adjustment mechanism 700 includes a base member 710, plural actuators 720 (e.g., six actuators 720), an absorption mechanism 730, and a bellows 740.

The base member 710 is engaged with the lower end portion 23*a* of the support member 23 positioned outside the processing container 20 via the vacuum seal 630 and is configured to be movable integrally with the stage 22. For example, the base member 710 includes a hole 711 having a larger diameter than the lower end portion 23*a* of the support member 23. The support member 23 passes through the hole 711 so that the lower end portion 23*a* thereof is connected to the rotary shaft 610. The vacuum seal 630 is provided around the rotary shaft 610 connected to the lower end portion 23*a* of the support member 23, and the base member 710 is fixed to the upper surface of the vacuum seal 630. Thus, the base member 710 is connected to the stage 22 via the vacuum seal 630, the rotary shaft 610, the support member 23 and the like, and can be moved integrally with the stage 22.

The actuators 720 are provided in parallel with each other between the bottom portion 27 of the processing container 20 and the base member 710. The actuators 720 move the base member 710 relative to the bottom portion 27 of the processing container 20 to adjust the position and inclination of the stage 22. Each of the actuators 720 is extendable and contractible. Each of the actuators 720 is rotatably and slidably connected to the base member 710 via a universal joint, and is rotatably and slidably connected to the bottom portion 27 of the processing container 20 via a universal joint. The actuators 720 and the base member 710 form a parallel link mechanism that can move the base member 710, for example, in the directions of the X', Y' and Z' axes shown in FIG. 5, and in the directions of rotation about the X' axis, rotation about the Y' axis and rotation about the Z' axis. A movement coordinate system of the parallel link mechanism formed by the actuators 720 and the base member 710 is adjusted in advance so as to match the coordinate system of the processing container 20. By connecting the bottom portion 27 of the processing container 20 and the base member 710 by the parallel link mechanism, the actuators 720 can move the base member 710 relative to the bottom portion 27 of the processing container 20. This makes it possible to adjust the position and inclination of the stage 22. For example, the actuators 720 adjust the position of the stage 22 by moving the base member 710 in a direction orthogonal to the outer wall surface of the bottom portion 27 of the processing container 20 (e.g., the Z'-axis direction in FIG. 5). Further, for example, the actuators 720 adjust the position of the stage 22 by moving the base member 710 in a direction along the outer wall surface of the bottom portion 27 of the processing container 20 (e.g., the X'-axis direction and the Y'-axis direction in FIG. 5). In addition, for example, the actuators 720 adjust the inclination of the stage 22 by tilting the base member 710 in a predetermined direction (e.g., the direction of rotation about the X' axis and the direction of rotation about the Y' axis in FIG. 5) with respect to the outer wall surface of the bottom portion 27 of the processing container 20.

The position and inclination of the stage 22 adjusted by the actuators 720 can be specified by detecting the position and inclination of the base member 710 using various detection means. Examples of the detection means include a linear encoder, a gyro sensor, a triaxial acceleration sensor, a laser tracker, and the like.

By the way, in the vacuum processing apparatus 2, when the pressure inside the processing container 20 is switched from the atmospheric pressure to the vacuum pressure, the processing container 20 is deformed due to the pressure difference. In addition, the temperature of the processing container 20 is changed due to the transfer of heat during the substrate processing performed in the processing container 20, and the processing container 20 is also deformed due to the temperature change. When the processing container 20 is deformed, the stress generated due to the deformation of the processing container 20 may be transmitted to the stage 22, and the position and inclination of the stage 22 may be changed.

Therefore, in the vacuum processing apparatus 2 according to the present embodiment, the actuators 720 are provided between the bottom portion 27 of the processing container 20 and the base member 710 that can move integrally with the stage 22. The actuators 720 adjust the position and inclination of the stage 22 by moving the base member 710 relative to the bottom portion 27. Accordingly, even when the position and inclination of the stage 22 are changed due to the deformation of the processing container 20, the position and inclination of the stage 22 can be adjusted to the original position and inclination. As a result, the vacuum processing apparatus 2 according to the present embodiment can improve the deviation of the position and inclination of the stage 22 caused by the deformation of the processing container 20. As a result, it is possible to improve the in-plane uniformity in the substrate processing such as a film forming process or the like.

The absorption mechanism 730 is provided in the bottom portion 27 of the processing container 20 to absorb deformation of the bottom portion 27 of the processing container 20. The absorption mechanism 730 is formed with a hole 731 that communicates with the inside of the processing container 20 through the hole 27*a* of the bottom portion 27 of the processing container 20. The actuators 720 are connected to the absorption mechanism 730 without being directly connected to the bottom portion 27 of the processing container 20. As a result, even if the bottom portion 27 of the processing container 20 is deformed, the stress generated by the deformation of the bottom portion 27 of the processing container 30 is absorbed by the absorption mechanism 730 and is not transmitted to the actuators 720. This makes it possible to suppress a decrease in the adjustment accuracy of the position and inclination of the stage 22. Details of the absorption mechanism 730 will be described later.

A bellows 740 is provided so as to surround the support member 23. The bellows 740 has an upper end connected to the bottom portion 27 of the processing container 20 through a hole 731 formed in the absorption mechanism 730 and a lower end connected to the base member 710. Thus, the bellows 740 hermetically seals the space between the bottom portion 27 of the processing container 20 and the base member 710. The bellows 740 is configured to expand and contract in response to the movement of the base member 710. For example, when the base member 710 is moved in the direction perpendicular to the outer wall surface of the bottom portion 27 of the processing container 20 (e.g., the Z'-axis direction in FIG. 5), the bellows 740 is expanded and contracted in the Z'-axis direction. Further, for example, when the base member 710 is moved in the direction along the outer wall surface of the bottom portion 27 of the processing container 20 (e.g., the X'-axis direction and the Y'-axis direction in FIG. 5), the bellows 740 is expanded and contracted in the X'-axis direction and the Y'-axis direction. Further, for example, when the base member 710 is moved in a predetermined direction (e.g., the direction of rotation about the X' axis and the direction of rotation about the Y' axis in FIG. 5) with respect to the outer wall surface of the bottom portion 27 of the processing container 20, the bellows 740 is expanded and contracted in the direction of rotation about the X' axis and in the direction of rotation about the Y' axis. In the vacuum processing apparatus 2, even when the base member 710 is moved, the bellows 740 is expanded and contracted so that the air does not flow into the processing container 20 via the space between the bottom portion 27 of the processing container 20 and the base member 710, the hole 731, and the hole 27*a*.

Figure 6:
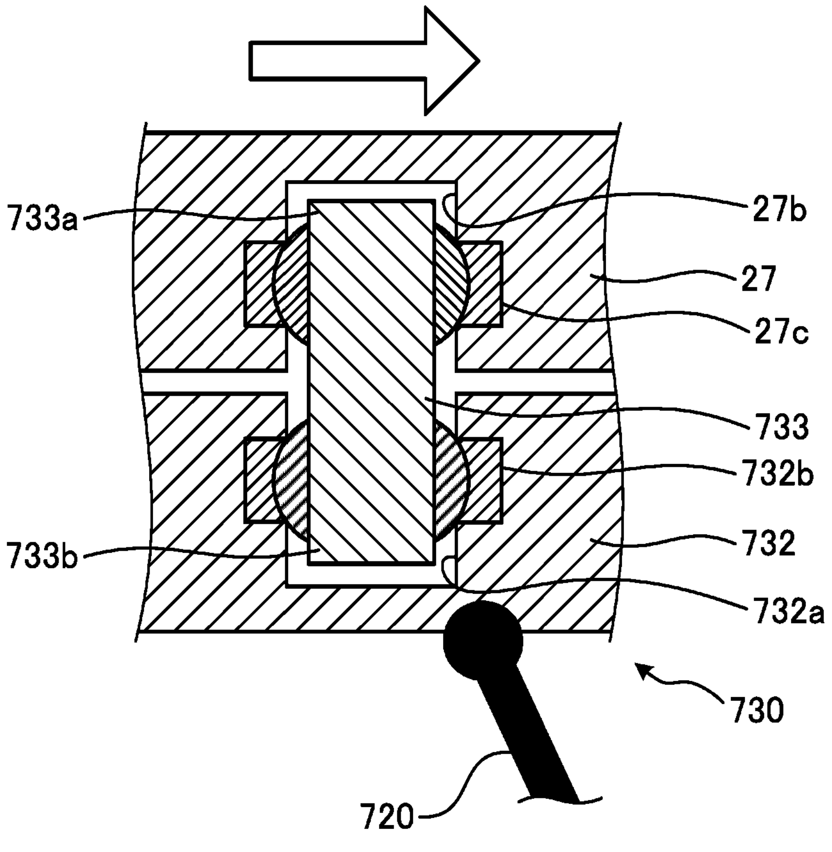
FIG. 6 is a diagram showing an example of the configuration of an absorption mechanism shown in FIG. 5.

Now, an example of the configuration of the absorption mechanism 730 will be described with reference to FIG. 6. FIG. 6 is a diagram showing an example of the configuration of the absorption mechanism 730 shown in FIG. 5. The absorption mechanism 730 includes a plate member 732 and a rod member 733.

The plate member 732 is formed in a disk shape and arranged below the bottom portion 27 of the processing container 20. From the viewpoint of blocking the transmission of heat and vibration from the processing container 20, the plate member 732 is spaced apart from the outer wall surface of the bottom portion 27 of the processing container 20.

The rod member 733 has one end, which is rotatably and slidably connected to the bottom portion 27 of the processing container 20, and the other end, which is rotatably and slidably connected to the plate member 732. That is, a recess 27*b* is formed on the outer wall surface of the bottom portion 27 of the processing container 20, and a spherical bearing 27*c* that can freely rotate and slide is attached to the recess 27*b*. One end portion 733*a* of the rod member 733 is connected to the spherical bearing 27*c*, whereby it can be rotatably and slidably connected to the bottom portion 27 of the processing container 20. On the other hand, a recess 732*a* is formed on the upper surface of the plate member 732 at a position corresponding to the recess 27*b*, and a spherical bearing 732*b* that can freely rotate and slide is attached to the recess 732*a*. The other end 733*b* of the rod member 733 is connected to the spherical bearing 732*b*, whereby it is rotatably and slidably connected to the plate member 732. The rod member 733 suppresses transmission of deformation to the plate member 732 by rotating in a direction corresponding to the deformation of the bottom portion 27 of the processing container 20. For example, when the bottom portion 27 of the processing container 20 is deformed in the direction of the arrow shown in FIG. 6, the rod member 733 receives the stress generated by the deformation of the bottom portion 27. However, the rod member 733 suppresses transmission of deformation to the plate member 732 by rotating together with the bottom portion 27 in the direction of the arrow in FIG. 6. The actuators 720 are connected to the plate member 732. As a result, the stress generated by the deformation of the bottom portion 27 of the processing container 20 is not transmitted to the actuators 720 via the plate member 732. This makes it possible to suppress a decrease in the adjustment accuracy of the position and inclination of the stage 22.

Further, the rod members 733 are arranged at plural circumferential positions of the plate member 732. For example, three rod members 733 are provided along the circumferential direction of the plate member 732 at plural positions inside the edge at equal intervals. Four or more rod members 733 may be provided at equal intervals along the circumferential direction of the plate member 732.

Next, a brief description will be given on the flow of a film forming process performed on the wafer W by the vacuum processing system 1 according to the embodiment.

The controller 8 controls the substrate transfer mechanism 15 to transfer the wafer W toward the vacuum processing apparatus 2. The controller 8 calculates the amount of deviation of the wafer W transferred by the substrate transfer mechanism 15 as the correction amount of the position of the wafer W. The correction amount of the position of the wafer W is calculated by, for example, detecting the amount of deviation between the wafer W and the target position of the transfer by the substrate transfer mechanism 15 using a position detection sensor provided at an arbitrary position on the transfer path of the wafer W. The position detection sensor is provided, for example, inside the vacuum transfer chamber 14 in which the substrate transfer mechanism 15 is arranged. Further, the position detection sensor may be provided at the loading/unloading port 21 of the vacuum processing apparatus 2. The target position is a position where the wafer W is mounted on the stage 22, and is, for example, a position where the center of the stage 22 and the center of the wafer W are coincident with each other.

The controller 8 controls the actuators 720 so that the base member 710 is moved from a predetermined reference position by the calculated correction amount. The reference position is a position at which the center of the stage 22 raised to the processing position should be positioned. For example, the reference position is a position where the center of the stage 22 and the center of the shower plate 43

(for example, the center of the region in which the gas discharge holes 45 are formed) are coincident with each other. The reference position is determined, for example, when the vacuum processing apparatus 2 is designed or when the vacuum processing apparatus 2 is adjusted.

As the base member 710 moves, the stage 22 also moves from the reference position by the correction amount. The controller 8 also controls the actuators 720 so that the base member 710 moves downward (i.e., in the negative direction of the Z' axis in FIG. 5) together with the stage 22. Thus, the lowering of the stage 22 is started. As the stage 22 moves downward, the lower ends of the lifter pins 26 contact the bottom portion 27 of the processing container 20 and the upper ends of the lifter pins 26 protrude from the mounting surface of the stage 22. At this stage, the stage 22 is lowered from the processing position to the delivery position.

When the substrate transfer mechanism 15 reaches the vacuum processing apparatus 2, the controller 8 controls the substrate transfer mechanism 15 to transfer the wafer W to above the target position in the processing container 20. At this stage, the center of the stage 22 and the center of the wafer W are coincident with each other.

The controller 8 delivers the wafer W between the stage 22 and the substrate transfer mechanism 15. For example, the controller 8 controls the actuators 720 so that the base member 710 moves to the reference position. For example, the controller 8 controls the actuators 720 so that the base member 710 moves upward (i.e., in the positive direction of the Z' axis in FIG. 5) together with the stage 22. As a result, the raising of the stage 22 begins. As the stage 22 moves upward, the lower ends of the lifter pins 26 are separated from the bottom portion 27 of the processing container 20 and the upper ends of the lifter pins 26 are accommodated in the mounting surface side of the pin through holes 26*a*. As the base member 710 moves, the stage 22 also moves to the reference position. At this stage, the center of the stage 22, the center of the wafer W, and the reference position are coincident with each other on a plane.

As described above, in the vacuum processing apparatus 2, instead of moving the substrate transfer mechanism 15 by the correction amount, the base member 710 and the stage 22 are integrally moved by the correction amount, and the wafer W is delivered. Therefore, the transfer load of the substrate transfer mechanism 15 can be reduced. As a result, the throughput of the entire vacuum processing system 1 can be improved.

For each vacuum processing apparatus 2, the controller 8 transfers the wafers W in parallel to the four processing spaces S1 to S4 in the processing container 20 of the vacuum processing apparatus 2. As a result, when the substrate transfer mechanism 15 transfers four wafers W to the four processing spaces S1 to S4 in the processing chamber 20 at the same time, the wafers W can be delivered between the stage 22 and the substrate transfer mechanism 15 at the same time. As a result, the throughput of the entire vacuum processing system 1 can be further improved.

The controller 8 performs the film forming process on the wafers W in the four processing spaces S1 to S4 for each vacuum processing apparatus 2. For example, the controller 8 controls the elevating mechanism 722 and the vacuum pump 62 to open the opening/closing valve 721, and the vacuum pump 62 reduces the pressure inside the processing container 20. The controller 8 controls the gas supply system 50, supplies various gases used for film formation from the gas supply system 50, and introduces various gases from the respective gas suppliers 4 into the processing spaces S1 to S4. Further, the controller 8 rotates the stage 22 by the drive mechanism 80. For example, the controller 8 controls the rotary drive mechanism 600 to rotate the support member 23 that supports the stage 22, thereby rotating the stage 22. Then, the controller 8 controls the high-frequency power sources 41, supplies high-frequency power from the high-frequency power sources 41, generates plasma in the processing spaces S1 to S4, and performs the film forming process on the wafer W. The controller 8 may rotate the stage 22 as necessary. Further, the controller 8 may stop the support member 23 without rotating it, and may perform the film forming process on the wafer W without rotating the stage 22.

When substrate processing such as film formation and etching is performed on a substrate such as a wafer W in which a recess is formed, the processing status of the substrate may be imbalanced between the upper portion and the lower portion of the side surface of the recess. As semiconductor devices have become highly integrated and miniaturized, the recess formed on a substrate becomes deeper and has a higher aspect ratio, and the imbalance in the processing status on the side surface of the recess becomes noticeable.

Figure 7:
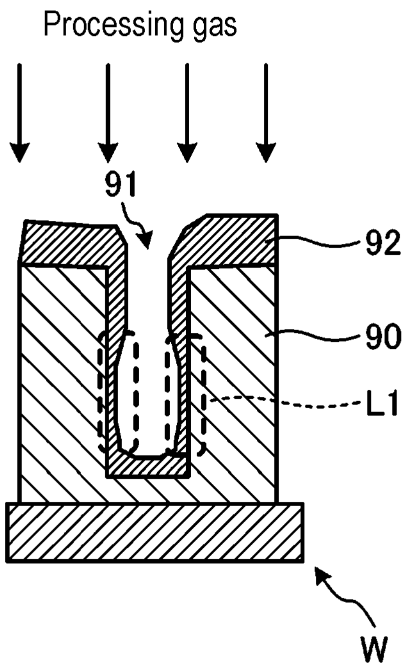
FIG. 7 is a diagram for explaining an example of the imbalance in a processing status of a side surface of a recess according to the embodiment.

FIG. 7 is a diagram for explaining an example of the imbalance in the processing status of the side surface of the recess 91 according to the embodiment. FIG. 7 shows the processing status of a film forming process in which a film 92 is formed on a wafer W having a recess 91. The recess 91 is, for example, a trench or contact hole. FIG. 7 shows the result of performing a film forming process as substrate processing with the wafer W mounted on the horizontal stage 22. In the wafer W, the film 92 is formed on the upper surface of the film 90 and the side and bottom surfaces of the recess 91. The film 92 is, for example, a SiN film or a $SiO_2$ film. However, there is an imbalance in the film forming process between the upper portion and the lower portion of the side surface of the recess 91. For example, as indicated by the broken line L1, the thickness of the film 92 is thinner at the lower portion of the side surface of the recess 91 than at the upper portion thereof.

Therefore, in the present embodiment, the controller 8 causes the stage 22 to be tilted by the drive mechanism 80 so that, during the film forming process, the central axis of the stage 22, which passes through the center of the mounting surface mounted with the wafer W and extends in a direction perpendicular to the mounting surface, forms an angle θ other than 0° with respect to a predetermined reference axis of the shower plate 43, which extends in the vertical direction. During the film forming process, the controller 8 performs substrate processing on the wafer W while causing the drive mechanism 80 to change the position of the stage 22 so that the central axis rotates around the reference axis while maintaining the angle θ with respect to the reference axis.

Figure 8:
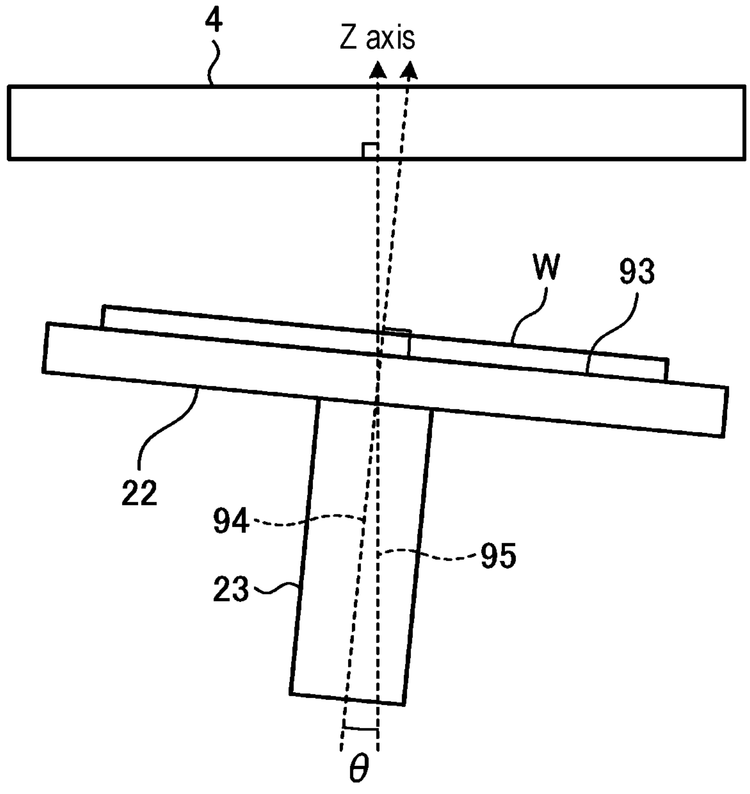
FIG. 8 is a diagram for explaining an example of a change in the position of a stage according to the embodiment.

FIG. 8 is a diagram for explaining an example of a change in the position of the stage 22 according to the embodiment. FIG. 8 shows the stage 22. A wafer W is mounted on the stage 22. In FIG. 8, there is shown a state in which the stage 22 is tilted so that the central axis 94 of the stage 22, which passes through the center of the mounting surface 93 mounted with the wafer W and extends in a direction perpendicular to the mounting surface 93, forms an angle θ with respect to the reference axis 95 of the shower plate 43, which extends in the vertical direction. The reference axis 95 is, for example, a vertical axis passing through the center of the shower plate 43. In FIG. 8, the reference axis 95 passes through the center of the shower plate 43 and faces the Z direction.

The drive mechanism 80 according to the present embodiment can cause the six actuators 720 of the adjustment mechanism 700 to move the stage 22 along the X, Y and Z axes and in the rotation directions about the three axes. Thus, the drive mechanism 80 can change the angle, the direction, and the position at which the stage 22 is tilted. As a result, the drive mechanism 80 can arbitrarily change the central position of the inclination of the mounting surface 93. For example, the drive mechanism 80 can set the central position of the inclination of the mounting surface 93 to the center of the upper surface of the mounting surface 93, the center of the wafer W, or a position higher than the center of the wafer W by 50 mm.

The controller 8 causes the drive mechanism 80 to tilt the stage 22 so that the central position of inclination of the mounting surface 93 is located on the central axis 94, and the central axis 94 forms an angle θ with respect to the reference axis 95.

Figure 9:
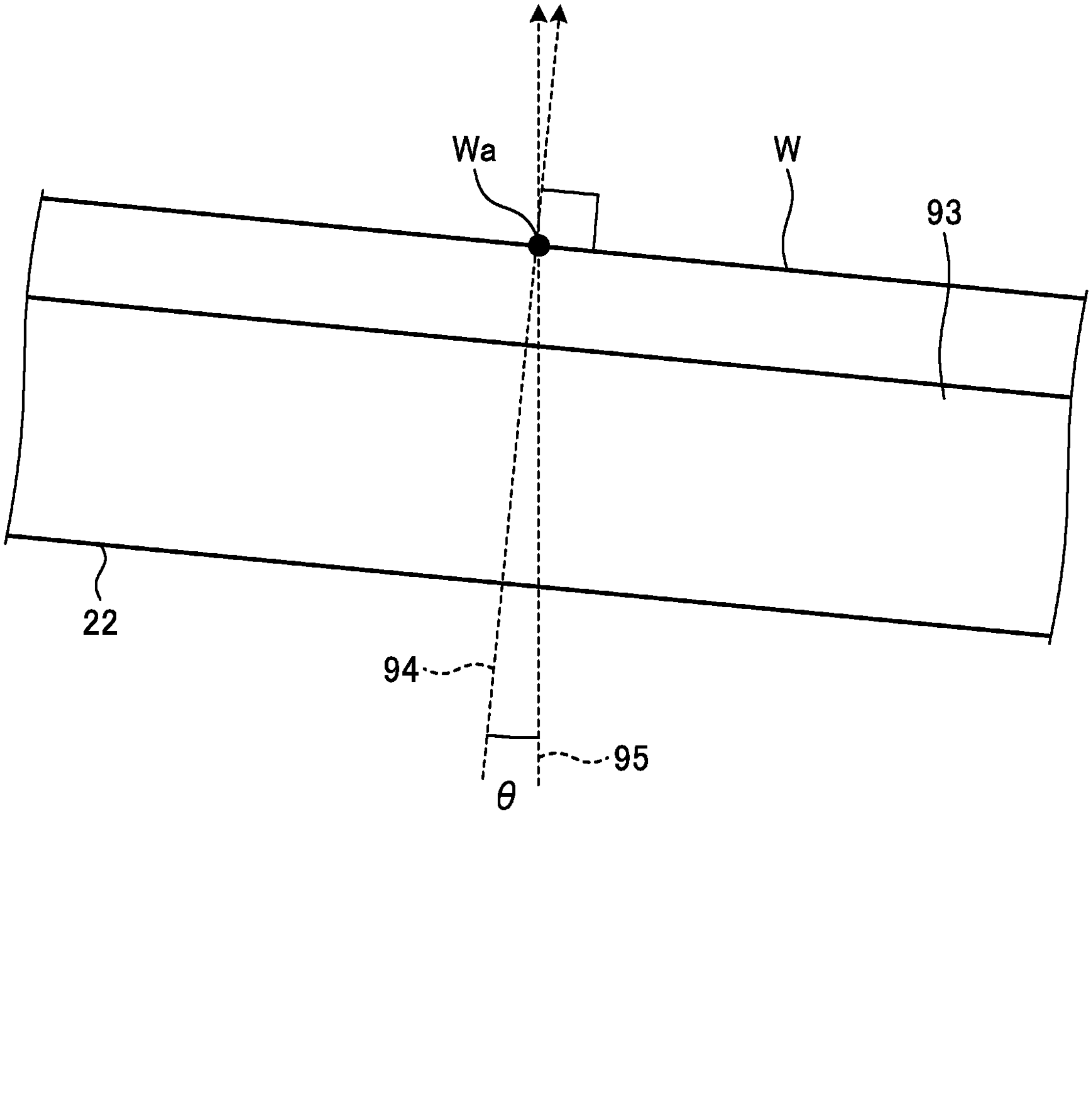
FIG. 9 is a diagram for explaining an example of a state in which the stage according to the embodiment is tilted.

For example, the controller 8 causes the drive mechanism 80 to tilt the stage 22 so that the central axis 94 forms an angle θ with respect to the reference axis 95 in a state in which the center of the upper surface of the wafer W mounted on the mounting surface 93 is located at an intersection of the reference axis 95 and the central axis 94. FIG. 9 is a diagram for explaining an example of the state in which the stage 22 according to the embodiment is tilted. FIG. 9 shows a state in which the stage 22 is tilted so that the central axis 94 forms an angle θ with respect to the reference axis 95 in a state in which the central point Wa of the upper surface of the wafer W is located at an intersection of the reference axis 95 and the central axis 94. Thus, the distance between the center of the upper surface of the wafer W and the shower plate 43 can be kept constant. Further, since the centers of the shower plate 43 and the wafer W coincident with each other, the process can be performed without being affected by the imbalance of the plasma. In addition, since the centers of the shower plate 43 and the wafer W are coincident with each other, the symmetry of a gas flow is less likely to collapse, which can contribute to uniform film formation.

Figure 10:
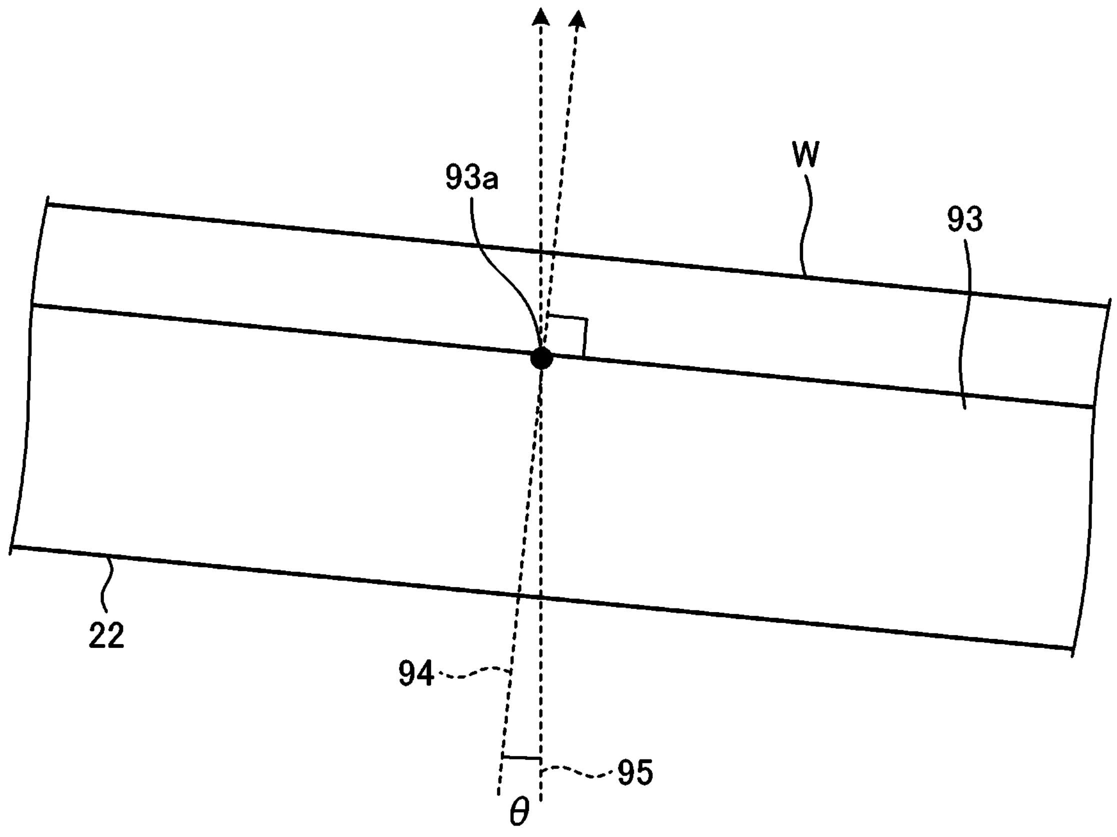
FIG. 10 is a diagram for explaining another example of the state in which the stage according to the embodiment is tilted.

The controller 8 may cause the drive mechanism 80 to tilt the stage 22 so that the central axis 94 forms an angle θ with respect to the reference axis 95 in a state in which the center of the upper surface of the mounting surface 93 is located at an intersection of the reference axis 95 and the central axis 94. FIG. 10 is a diagram for explaining another example of the state in which the stage 22 according to the embodiment is tilted. FIG. 10 shows a state in which the stage 22 is tilted so that the central axis 94 forms an angle θ with respect to the reference axis 95 in a state in which the central point 93*a* of the upper surface of the mounting surface 93 is located at an intersection of the reference axis 95 and the central axis 94. In this case, although the distance between the center of the upper surface of wafer W and the shower plate 43 is slightly changed depending on the angle θ, the distance between the center of the upper surface of the wafer W and the shower plate 43 can be kept substantially constant.

The angle θ is set to any angle in the range of −0.1° to +0.1°. For example, the angle θ is set to 0.1°. This can prevent the wafer W from slipping on the stage 22.

Figure 11:
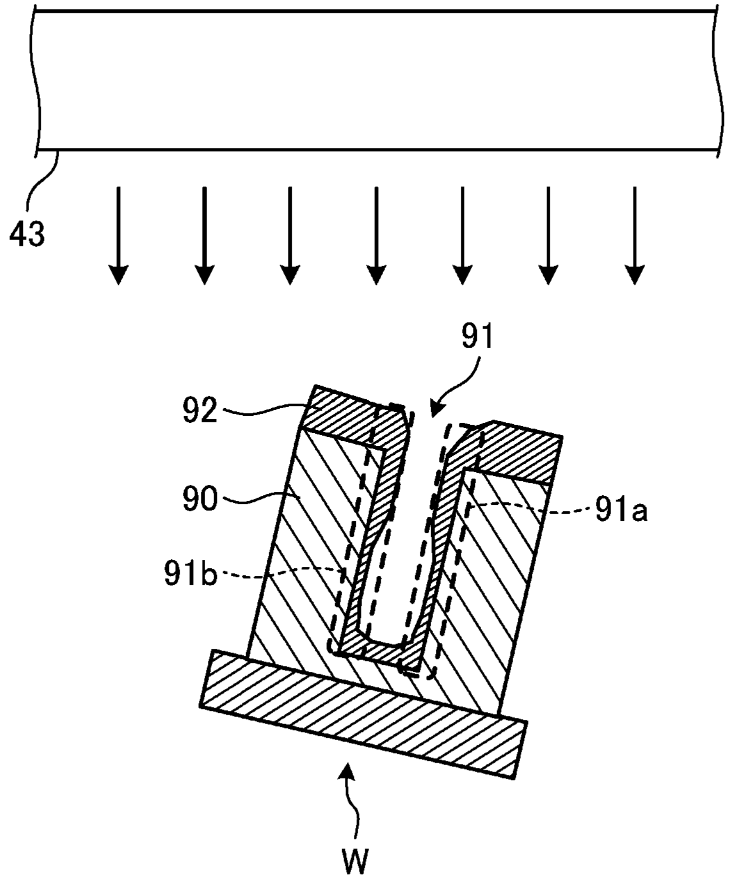
FIG. 11 is a diagram for explaining an example of film formation in a recess of a tilted wafer according to the embodiment.

By tilting the stage 22, the wafer W mounted on the stage 22 is tilted with respect to the shower plate 43 together with the stage 22. When the wafer W is tilted with respect to the shower plate 43, the recess 91 formed on the wafer W has a surface where a deposition rate increases and a surface where a deposition rate decreases. FIG. 11 is a diagram for explaining an example of the film formation in the recess 91 of the tilted wafer W according to the embodiment. For example, the gas entering from above can easily come in contact with the side surface 91*a* on the lower side of the recess 91, so that the deposition rate increases. On the other hand, the side surface 91*b* on the upper side of the recess 91 is less likely to come into contact with the gas entering from above, so that the deposition rate decreases.

Figure 12:
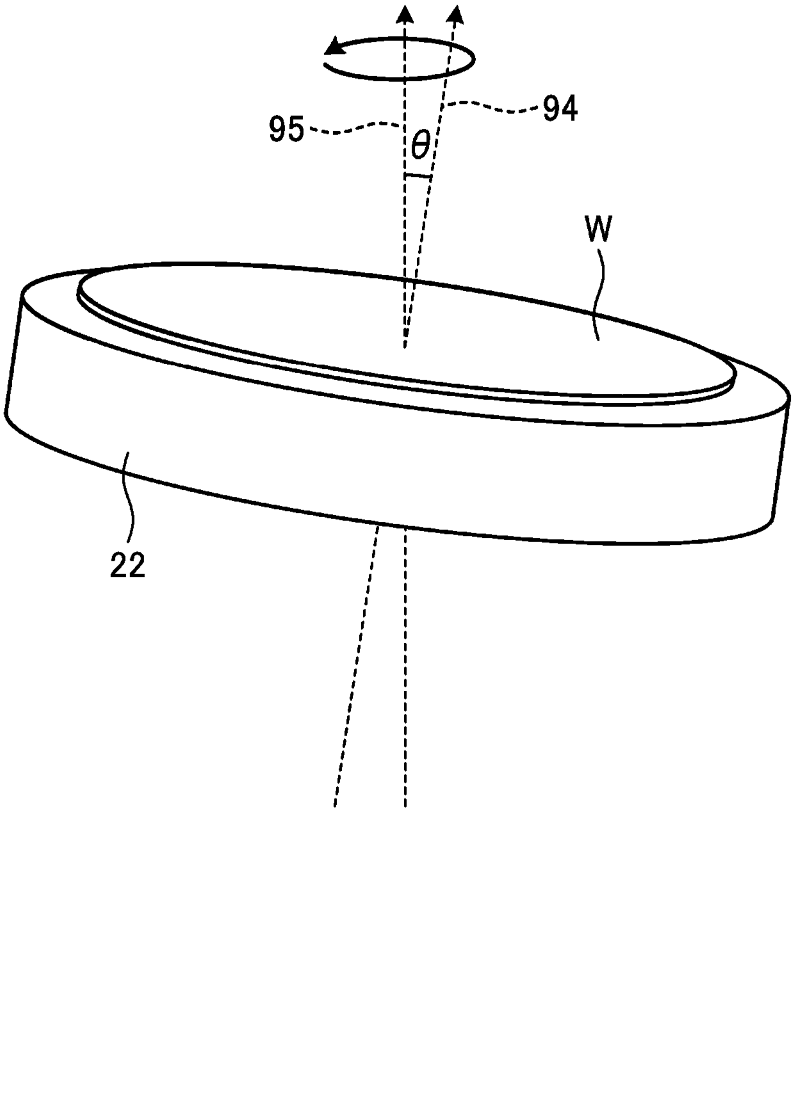
FIG. 12 is a diagram for explaining an example of a change in the position of a stage according to the embodiment.
Figure 13:
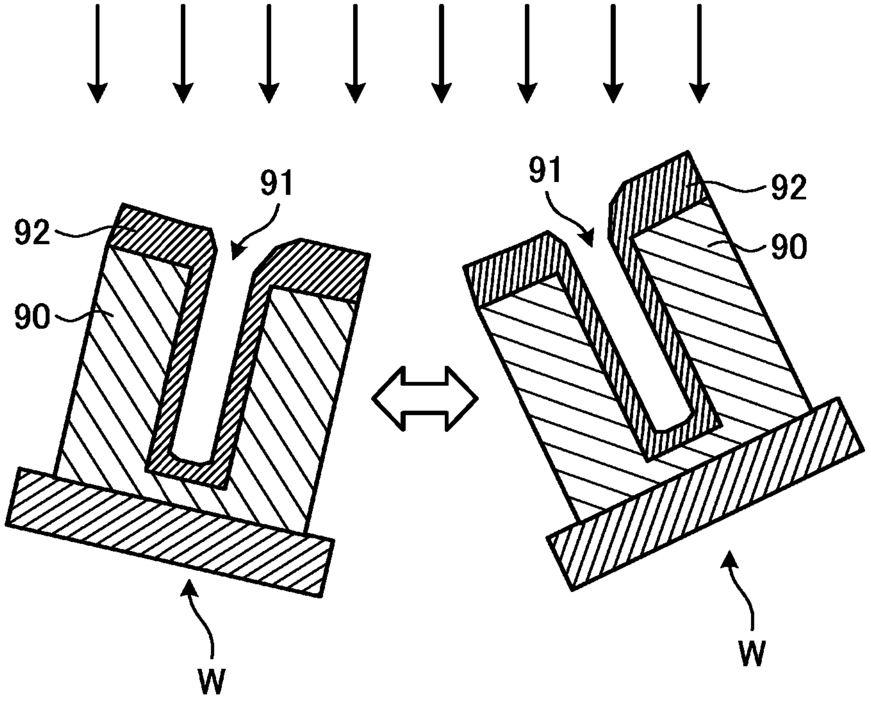
FIG. 13 is a diagram for explaining an example of a change in the tilt of a wafer W according to the embodiment.

The controller 8 performs a film forming process on the wafer W while causing the drive mechanism 80 to change the position of the stage 22 during the film forming process so that the central axis 94 rotates around the reference axis 95 while maintaining the angle θ with respect to the reference axis 95. FIG. 12 is a diagram for explaining an example of the change in the position of the stage 22 according to the embodiment. When the central axis 94 rotates around the reference axis 95, the mounting surface 93 of the stage 22 is tilted with respect to the shower plate 43, and the direction of tilt of the mounting surface 93 is changed in the circumferential direction. By changing the position of the stage 22 in this way, the wafer W mounted on the stage 22 is tilted with respect to the shower plate 43, and the direction of tilt of the wafer W is also changed in the circumferential direction. FIG. 13 is a diagram for explaining an example of the change in the tilt of the wafer W according to the embodiment. As shown in FIG. 13, the direction in which the wafer W is tilted with respect to the shower plate 43 is changed.

It is preferable that the rotation speed at which the central axis 94 rotates around the reference axis 95 during the film forming process is π [rad/sec] or less. This can prevent the wafer W from slipping on the stage 22. Further, the gas flow on the upper surface of the wafer W can follow the movement of the stage 22, and the film forming process can be performed on the wafer W stably.

The controller 8 controls the drive mechanism 80 during the film forming process, and causes the drive mechanism 80 to change the position of the stage 22 so that the central axis 94 rotates around the reference axis 95 plural times. It is preferable that the controller 8 performs control so that the central axis 94 rotates around the reference axis 95 an integral number of times during the film forming process. Since the central axis 94 rotates around the reference axis 95 plural times during the film forming time as described above, it is possible to perform a film forming process uniformly on the side surfaces of the recess 91 in the respective directions.

Further, the controller 8 may dynamically change the angle θ during the film forming process. For example, the controller 8 may dynamically change the angle θ each time when the central axis 94 makes one turn around the reference axis 95. For example, the controller 8 may gradually increase the angle θ to 0.01° in a first period, 0.03° in a second period, 0.05° in a third period, and so on. The controller 8 may gradually reduce the angle θ after half the process has passed. By dynamically changing the angle θ in this manner, it is possible to perform a film forming process uniformly on the side surfaces of the recess 91 in the respective directions.

Further, in the case of the configuration in which four processing spaces S1 to S4 are provided in the processing container 20 of the vacuum processing apparatus 2 so that four wafers W can be processed in parallel as in the present embodiment, the controller 8 may control each drive mechanism 80 so as to cancel the vibration of the processing spaces S1 to S4 caused by the movement of the stage 22. For example, in the processing spaces S1 to S4, the controller 8 rotates the central axes 94 in the same direction by shifting the starting positions of rotation of the central axes 94 with respect to the reference axis 95 by 90°. For example, in the processing spaces S1 to S4, the controller 8 rotates the central axes 94 in the same direction with respect to the respective reference axis 95 while setting the positions on the side of the combined exhaust path 32 to the starting positions of rotation. As a result, in the processing spaces S1 and S4, and the processing spaces S2 and S3, which are located diagonally in the processing container 20, the starting positions of rotation are shifted by 180°, and the vibrations are generated in opposite directions. As a result, the vibrations can cancel each other out so as to reduce the vibrations.

As described above, in the vacuum processing apparatus 2 according to the present embodiment, during the film forming process, by changing the direction of the tilt of the stage 22 in the circumferential direction in a state in which the stage 22 is tilted with respect to the shower plate 43, the side surface on the lower side of the recess 91 is changed sequentially. As a result, a film can be formed sequentially on the entire side surface of the recess 91, and the imbalance in the film forming status on the side surface of the recess 91 can be improved.

Specific Example of Flow of Substrate Processing Method

Figure 14:
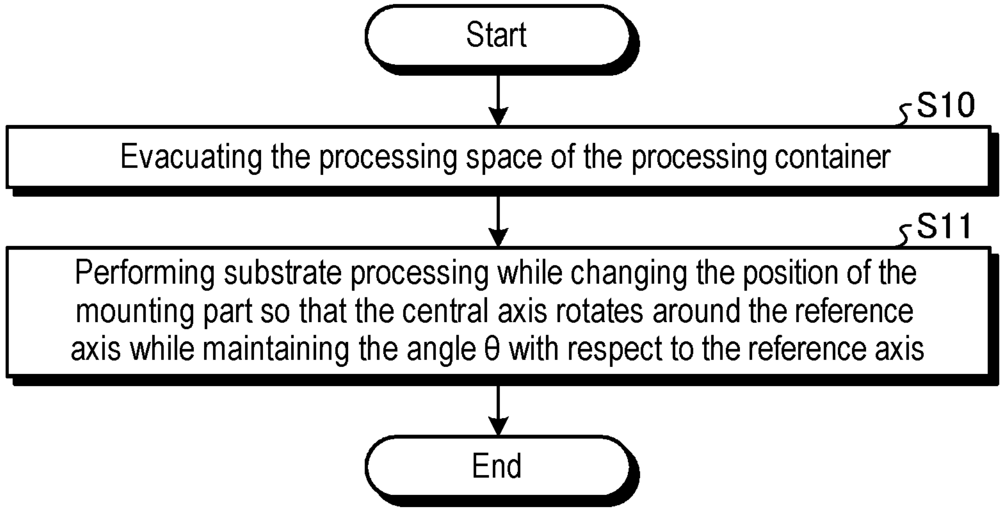
FIG. 14 is a flowchart showing an example of the flow of a substrate processing method according to an embodiment.

Next, a specific example of the flow of the substrate processing method according to the embodiment will be described. FIG. 14 is a flowchart showing an example of the flow of the substrate processing method according to the embodiment. FIG. 14 shows an example of the flow of a film forming process performed as substrate processing.

The controller 8 evacuates the processing space S1 of the processing container 20 (step S10). For example, the controller 8 performs the evacuation with the vacuum pump 62 and evacuates the processing space S1 from the surroundings of the stage 22 with the guide member 34.

The controller 8 causes the drive mechanism 80 to tilt the stage 22 so that the central axis 94 forms an angle θ with respect to the reference axis 95. The controller 8 performs a film forming process on the wafer W while changing the position of the stage 22 so that the central axis 94 rotates around the reference axis 95 while maintaining the angle θ (step S11).

As a result, the vacuum processing apparatus 2 can improve the imbalance in the processing status of the side surface of the recess 91.

Effects of the Embodiment

As described above, the substrate processing method according to the embodiment is a substrate processing method performed in a substrate processing apparatus (e.g., the vacuum processing system 1 or the vacuum processing apparatus 2). The substrate processing apparatus includes a processing container 20, a shower plate 43, a stage 22, and a drive mechanism 80. The shower plate 43 constitutes a ceiling wall of the processing container 20 and discharges gases used for substrate processing (e.g., a film forming process). The stage 22 is arranged under the shower plate 43 inside the processing container 20 so as to face the shower plate 43, and is configured to mount a wafer W having a recess 91 thereon. The drive mechanism 80 is configured to move the stage 22. The substrate processing method includes a substrate processing process (e.g., step S11). In the substrate processing process, the stage 22 is tilted by the drive mechanism 80 so that the central axis 94 of the stage 22, which passes through the center of the mounting surface 93 mounted with the wafer W and extends in a direction perpendicular to the mounting surface 93, forms a first angle (angle θ) other than 0° with respect to a predetermined reference axis 95 of the shower plate 43, which extends in the vertical direction. In the substrate processing process, substrate processing is performed on the wafer W while changing the position of the stage 22 by the drive mechanism 80 so that the central axis 94 rotates around the reference axis 95 while maintaining the first angle with respect to the reference axis 95. As a result, the substrate processing method according to the embodiment can improve the imbalance in the processing status of the side surface of the recess 91.

In the substrate processing method according to the embodiment, during the substrate processing process, the stage 22 is tilted by the drive mechanism 80 so that the central axis 94 forms the first angle with respect to the reference axis 95 in a state in which the center of the upper surface of the wafer W mounted on the mounting surface 93 is located at an intersection of the reference axis 95 and the central axis 94. In the substrate processing method, during the substrate processing process, the position of the stage 22 is changed by the drive mechanism 80 so that the central axis 94 rotates around the reference axis 95 while maintaining the first angle with respect to the reference axis 95. Thus, the substrate processing method according to the embodiment can keep the distance between the center of the upper surface of the wafer W and the shower plate 43 constant. This allows the process to be performed without being affected by plasma imbalance. Moreover, the symmetry of a gas flow is less likely to collapse, which contributes to the uniformity of substrate processing.

In the substrate processing method according to the embodiment, during the substrate processing process, the stage 22 is tilted by the drive mechanism 80 so that the central axis 94 forms the first angle with respect to the reference axis 95 in a state in which the center of the upper surface of the mounting surface 93 is located at an intersection of the reference axis 95 and the central axis 94. Further, in the substrate processing method, during the substrate processing process, the position of the stage 22 is changed by the drive mechanism 80 so that the central axis 94 rotates around the reference axis 95 while maintaining the first angle with respect to the reference axis 95. Thus, the substrate processing method according to the embodiment can keep the distance between the center of the upper surface of the wafer W and the shower plate 43 constant. This allows the process to be performed without being affected by plasma imbalance. Moreover, the substrate processing can be performed while suppressing the collapse of the symmetry of a gas flow.

The reference axis 95 is a vertical axis that passes through the center of the shower plate 43. Accordingly, in the substrate processing method according to the embodiment, the substrate processing can be performed symmetrically about the central axis 94 with respect to the stage 22.

Further, in the substrate processing method according to the embodiment, during the substrate processing process, the position of the stage 22 is changed by the drive mechanism 80 so that the central axis 94 rotates around the reference axis 95 plural times. As a result, the substrate processing method according to the embodiment can suppress the imbalance in the processing result of the substrate processing on the side surfaces of the recess 91 in the respective directions even if the substrate processing is not uniform in a part of the substrate processing period such as a first half period or a second half period.

Further, the first angle is set to any angle in a range of −0.1° to +0.1°. Thus, the substrate processing method according to the embodiment can prevent the wafer W from slipping on the stage 22.

Further, in the substrate processing method according to the embodiment, during the substrate processing process, the position of the stage 22 is changed by the drive mechanism 80 so that the central axis 94 rotates around the reference axis 95 at a rotation speed of π [rad/sec] or less. Accordingly, in the substrate processing method according to the embodiment, the gas flow on the upper surface of the wafer W can follow the movement of the stage 22, and the wafer W can be stably subjected to substrate processing.

Although the embodiment has been described above, the embodiment disclosed herein should be considered as exemplary and not restrictive in all respects. The embodiment described above may be omitted, substituted, or modified in various ways without departing from the scope and spirit of the claims.

For example, in the above-described embodiment, there has been described an example where the vacuum processing apparatus 2 is an apparatus that performs a film forming process as substrate processing. However, the present disclosure is not limited thereto. The substrate processing may be, for example, an etching process such as plasma etching or the like, or may be any substrate processing. The disclosed technique may be applied to any apparatus that performs other substrate processing such as plasma etching and the like.

Further, in the above-described embodiment, the case where the substrate is the wafer W has been described by way of example. However, the present disclosure is not limited thereto. The substrate may be any substrate such as, for example, a glass substrate or the like.

According to the present disclosure in some embodiments, it is possible to improve the imbalance in a processing status of a side surface of a recess formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method performed in a substrate processing apparatus including a processing container, a shower plate forming a ceiling wall of the processing container and configured to discharge gases used for a substrate processing, a stage arranged under the shower plate inside the processing container so as to face the shower plate and configured to mount a substrate thereon, and a drive mechanism configured to move the stage, the substrate processing method comprising:

a substrate processing process performing the substrate processing on the substrate in a state in which the stage is tilted by the drive mechanism so that a central axis of the stage, which passes through a center of a mounting surface mounted with the substrate and extends in a direction perpendicular to the mounting surface, forms a first angle other than 0° with respect to a predetermined reference axis of the shower plate, which extends in a vertical direction, while changing a position of the stage by the drive mechanism so that the central axis rotates around the reference axis while maintaining the first angle with respect to the reference axis, wherein during the substrate processing process, the stage is tilted by the drive mechanism so that the central axis forms the first angle with respect to the reference axis in a state in which a center of an upper surface of the substrate mounted on the mounting surface is located at an intersection of the reference axis and the central axis, and the position of the stage is changed by the drive mechanism so that the central axis rotates around the reference axis while maintaining the first angle with respect to the reference axis.

2. The substrate processing method of claim 1, wherein the reference axis is a vertical axis that passes through a center of the shower plate.

3. The substrate processing method of claim 2, wherein during the substrate processing process, the position of the stage is changed by the drive mechanism so that the central axis rotates around the reference axis plural times.

4. The substrate processing method of claim 3, wherein the first angle is set to an angle in a range of −0.1° to +0.1°.

5. The substrate processing method of claim 4, wherein during the substrate processing process, the position of the stage is changed by the drive mechanism so that the central axis rotates around the reference axis at a rotation speed of π [rad/sec] or less.

6. The substrate processing method of claim 5, wherein the drive mechanism is configured to rotate the stage by rotating a support member that supports the stage as a rotation axis, and wherein in the substrate processing process, the substrate is processed by rotating the stage.

7. The substrate processing method of claim 6, wherein the drive mechanism is configured such that actuators function as a parallel link mechanism to move the stage in three orthogonal directions of three axes and in rotation directions around the three axes.

8. A substrate processing method performed in a substrate processing apparatus including a processing container, a shower plate forming a ceiling wall of the processing container and configured to discharge gases used for a substrate processing, a stage arranged under the shower plate inside the processing container so as to face the shower plate and configured to mount a substrate thereon, and a drive mechanism configured to move the stage, the substrate processing method comprising:

a substrate processing process performing the substrate processing on the substrate in a state in which the stage is tilted by the drive mechanism so that a central axis of the stage, which passes through a center of a mounting surface mounted with the substrate and extends in a direction perpendicular to the mounting surface, forms a first angle other than 0° with respect to a predetermined reference axis of the shower plate, which extends in a vertical direction, while changing a position of the stage by the drive mechanism so that the central axis rotates around the reference axis while maintaining the first angle with respect to the reference axis, wherein during the substrate processing process, the stage is tilted by the drive mechanism so that the central axis forms the first angle with respect to the reference axis in a state in which a center of an upper surface of the mounting surface is located at an intersection of the reference axis and the central axis, and the position of the stage is changed by the drive mechanism so that the central axis rotates around the reference axis while maintaining the first angle with respect to the reference axis.

9. The substrate processing method of claim 1, wherein during the substrate processing process, the position of the stage is changed by the drive mechanism so that the central axis rotates around the reference axis plural times.

10. The substrate processing method of claim 1, wherein the first angle is set to an angle in a range of −0.1° to +0.1°.

11. The substrate processing method of claim 1, wherein during the substrate processing process, the position of the stage is changed by the drive mechanism so that the central axis rotates around the reference axis at a rotation speed of π [rad/sec] or less.

12. The substrate processing method of claim 1, wherein the drive mechanism is configured to rotate the stage by rotating a support member that supports the stage as a rotation axis, and wherein in the substrate processing process, the substrate is processed by rotating the stage.

13. The substrate processing method of claim 1, wherein in the substrate processing process, the substrate is processed in a state in which a support member that supports the stage is stopped without being rotated about a rotation axis.

14. The substrate processing method of claim 1, wherein the drive mechanism is configured such that actuators function as a parallel link mechanism to move the stage in three orthogonal directions of three axes and in rotation directions around the three axes.

15. A substrate processing apparatus, comprising:

a processing container, a shower plate forming a ceiling wall of the processing container and configured to discharge gases used for a substrate processing;

a stage arranged under the shower plate inside the processing container so as to face the shower plate and configured to mount a substrate thereon;

a drive mechanism configured to move the stage; and a controller configured to perform the substrate processing on the substrate in a state in which the stage is tilted by the drive mechanism so that a central axis of the stage, which passes through a center of a mounting surface mounted with the substrate and extends in a direction perpendicular to the mounting surface, forms a first angle other than 0° with respect to a predetermined reference axis of the shower plate, which extends in a vertical direction, while changing a position of the stage by the drive mechanism so that the central axis rotates around the reference axis while maintaining the first angle with respect to the reference axis, wherein during the substrate processing, the stage is tilted by the drive mechanism so that the central axis forms the first angle with respect to the reference axis in a state in which a center of an upper surface of the substrate mounted on the mounting surface is located at an intersection of the reference axis and the central axis, and the position of the stage is changed by the drive mechanism so that the central axis rotates around the reference axis while maintaining the first angle with respect to the reference axis.

* * * * *